United States Patent
Floyd

(10) Patent No.: US 7,265,630 B2
(45) Date of Patent: Sep. 4, 2007

(54) MILLIMETER-WAVE UNILATERAL LOW-NOISE AMPLIFIER

(75) Inventor: Brian Allan Floyd, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/731,341

(22) Filed: Dec. 9, 2003

(65) Prior Publication Data

US 2005/0122173 A1    Jun. 9, 2005

(51) Int. Cl.
*H03F 3/191* (2006.01)
(52) U.S. Cl. .................. 330/302; 330/310; 330/311
(58) Field of Classification Search ............... 330/302, 330/310, 311
See application file for complete search history.

(56) References Cited

U.S. PATENT DOCUMENTS

| | | | | |
|---|---|---|---|---|
| 5,933,057 | A * | 8/1999 | Tchamov et al. | 330/302 |
| 6,166,599 | A * | 12/2000 | Aparin et al. | 330/302 |
| 6,249,186 | B1 * | 6/2001 | Ebihara et al. | 330/310 |
| 6,806,777 | B2 * | 10/2004 | Franca-Neto | 330/311 |
| 2003/0030494 | A1 * | 2/2003 | Huang | 330/302 |

OTHER PUBLICATIONS

Tang et al., "A 1.2 V, 1.8 GHz CMOS two-stage LNA with common-gate amplifier as an input stage", ASIC, 2003, Proceedings, 5th International Conference on vol. 2, Oct. 21-24, 2003, p. 1044, IEEE.*

L. Tran et al., "High Performance, High Yield Millimeter-Wave MMIC LNAs Using InP HEMTs," IEEE IMS Digest, p. 9-12, Jun. 1996.

M. Siddiqui et al., "GaAs Components for 60GHz Wireless Communication Applications," GaAs Mantech Conference, pp. 1-4, Apr. 2002.

A. Fujihara et al., "High Performance 60-GHz Coplanar MMIC LNA Using InP Heterojunction FETs with AlAs/InAs Superlattice Layer," IEEE IMS Digest, p. 21-24, Jun. 2000.

K. Nishikawa et al. "Compact LNA and VCO 3-D MMICs Using Commercial GaAs PHEMT Technology for V-band Single-chip TRX MMIC," IEEE IMS Digest, p. 1717-1720, Jun. 2002.

K. Onodera et al., "V-Band Monolithic Low-Noise Amplifiers Using Ion-Implanted n+-Self-Aligned GaAs MESFETs," IEEE Mircowave Guided Wave Letters, vol. 9, No. 4, pp. 148-150, Apr. 1999.

B. Jagannathan et al., "Self-Aligned SiGe NPN Transistors with 285 GHz $f_{MAX}$ and 207 GHz $f_T$ in a Manufacturable Technology," IEEE Electron Device Letters, vol. 23, No. 5, pp. 258-260, May 2002.

* cited by examiner

*Primary Examiner*—Khanh Van Nguyen
(74) *Attorney, Agent, or Firm*—Anne V. Dougherty; Ryan, Mason & Lewis, LLP

(57) ABSTRACT

Principles of the present invention provide improved amplifiers such as low-noise amplifiers. While such amplifiers may be suitable in many applications, such amplifiers may provide improved noise, gain and stability performance at millimeter-wave frequencies. In a first aspect of the invention, an amplifier includes a first amplifying stage including a common-base transistor, and a second amplifying stage, coupled to the first amplifying stage, including a cascode transistor pair. The amplifier may be implemented in accordance with a silicon-based technology (e.g., silicon germanium) and may employ microstrip shunt-stub transmission lines as matching networks.

17 Claims, 4 Drawing Sheets

MILLIMETER-WAVE UNILATERAL LOW-NOISE AMPLIFIER

STATEMENT OF GOVERNMENT RIGHTS

This invention was made with Government support under grant contract number NAS3-03070 awarded by the National Aeronautics and Space Administration. The Government has certain rights in this invention.

FIELD OF THE INVENTION

The present invention relates to communications systems and, more particularly, to low-noise amplifiers associated with millimeter-wave communications transceivers.

BACKGROUND OF THE INVENTION

Being the first active circuit after the antenna, the low-noise amplifier (LNA) is a critical building block for radio transceivers at millimeter-wave frequencies. To increase receiver sensitivity and reduce the amount of noise contributed by subsequent states, the LNA is required to have a moderate gain and a low noise figure. Also, the LNA should be unconditionally stable (i.e., not oscillate when attached to other components), and impedance matched to its surrounding environment.

Typically, millimeter-wave LNAs are built in III-V technologies as individual chips, see, e.g., L. Tran et al., "High Performance, High Yield Millimeter-Wave MMIC LNAs Using InP HEMTs," IEEE IMS Digest, p. 9-12, June 1996; M. Siddiqui et al., "GaAs components for 60 GHz wireless communication applications," GaAs Mantech Conference, April 2002; A. Fujihara et al., "High performance 60-GHz coplanar MMIC LNA using InP heterojunction FETs with AlAs/InAs superlattice layer," IEEE IMS Digest, p. 21-24, June 2000; K. Nishikawa et al. "Compact LNA and VCO 3-D MMICs using commercial GaAs PHEMT technology for V-band single-chip TRX MMIC," IEEE IMS Digest, p. 1717-1720, June 2002; and K. Onodera et al., "V-band monolithic low-noise amplifiers using ion-implanted n+-self-aligned GaAs MESFETs," IEEE Microwave Guided Wave Ltr., v. 9, n. 4, p. 148-150, April 1999, the disclosures of which are incorporated by reference herein. These LNA chips are then packaged, often with waveguide connectors. Realizing a full millimeter-wave transceiver involves assembling multiple chips, often with these bulky waveguide connectors, into a fairly large and expensive solution.

SUMMARY OF THE INVENTION

Principles of the present invention provide improved amplifiers such as low-noise amplifiers. While such amplifiers may be suitable in many applications, such amplifiers may provide improved noise, gain and stability performance at millimeter-wave frequencies.

In a first aspect of the invention, an amplifier includes a first amplifying stage including a common-base transistor, and a second amplifying stage, coupled to the first amplifying stage, including a cascode transistor pair.

The amplifier may also include an input matching network coupled between an input terminal associated with the amplifier and the common-base transistor, an inter-stage matching network coupled between the common-base transistor and the cascode transistor pair, and/or an output matching network coupled between an output terminal associated with the amplifier and the cascode transistor pair. At least one matching network may include at least one shunt-stub microstrip transmission line. A current associated with the second stage may be adjustable. The first stage and the second stage may be implemented in accordance with a silicon-based technology such as a silicon germanium technology. The amplifier may be a low-noise amplifier and/or may be a unilateral amplifier. The low-noise amplifier may be implemented in accordance with a millimeter-wave communications receiver.

In a second aspect of the invention, apparatus for amplifying an input signal includes a low-noise amplifier operative to amplify the input signal, wherein the low-noise amplifier is implemented in accordance with a silicon-based technology and the input signal is a millimeter-wave signal.

In a third aspect of the invention, apparatus for amplifying an input signal includes an amplifier operative to amplify the input signal, wherein the amplifier is implemented in accordance with a silicon-based technology and includes at least one matching network including at least one shunt-stub microstrip transmission line.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

In accordance with principles of the present invention, it has been realized that advanced silicon germanium (SiGe) technology offers the potential of realizing high performance millimeter-wave functionality in a highly-integrated solution. Thus, the cost of a SiGe transceiver at millimeter-wave can potentially be drastically lower than conventional III-V solutions. The principles of the present invention provide a unilateral low-noise amplifier for millimeter-wave applications designed and implemented in SiGe technology. Advantageously, such a low-noise amplifier may have a moderate to high gain, a low noise figure, and be unconditionally stable, as will be illustrated below.

As used herein, the term "unilateral" generally refers to, in the context of an amplifier, the fact that signals associated with the amplifier can flow only from input to output, due to the amplifier having high reverse isolation. Reverse isolation is also referred to as reverse gain, which represents the gain one would see at the input of the amplifier if it were reverse driven, i.e., driven from the amplifier output. Any reflections occurring at a unilateral amplifier's output would not be "seen" at the input; thus, input and output impedance matching networks are independent. "Bilateral" refers to, in the context of an amplifier, the fact that signals associated with the amplifier can flow in both directions (e.g., input to output and output to input), due to the amplifier having poor reverse isolation. Bilateral amplifiers therefore have input and output matching networks which are dependent on one another.

A key step to making an LNA unconditionally stable is to achieve high reverse isolation. In accordance with the invention and by way of example only, "high" reverse isolation may represent isolation of about 20 dB greater than the amplifier's gain, or approximately 30-40 dB.

Reverse isolation has to be achieved both in the circuit itself as well as in the substrate, which is particularly important for silicon implementations, since the silicon substrate is low impedance at millimeter-wave frequencies. As mentioned above, a feature of a unilateral amplifier is that input and output matching networks are de-coupled. As a result, designing a unilateral amplifier is much simpler than designing a bilateral amplifier, since the designer does not need to carefully balance the input, inter-stage (if present) and output matching networks simultaneously. Instead, the designer of a unilateral amplifier can optimize each matching network separately. As a result, topologies which are simpler to design also tend to be better performing, since the designer has more time to optimize as well as more intuition about the circuit.

Figure 1:
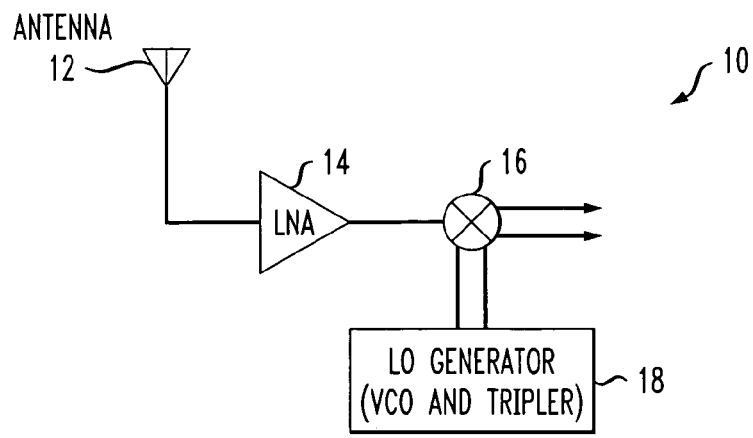
FIG. 1 is a block diagram illustrating a highly-integrated millimeter-wave receiver front-end in which a low-noise amplifier according to an embodiment of the invention may be employed.

Referring initially to FIG. 1, a block diagram illustrates a highly-integrated millimeter-wave receiver front-end in which a low-noise amplifier according to an embodiment of the invention may be employed.

The receiver front-end 10 includes an antenna 12, followed by an LNA 14, and a frequency downconverter 16. The downconverter can be realized in a number of ways, depending on the radio architecture and required performance. As illustratively shown in FIG. 1, the frequency downconverter is implemented as an active mixer for use in a superheterodyne radio. Also shown in FIG. 1 is a local oscillator (LO) generator block 18 which includes an on-chip voltage-controlled oscillator (VCO) and a frequency tripler.

Since the focus of the invention is on a unilateral low-noise amplifier (e.g., LNA 14) and since the other components in the receiver architecture shown in FIG. 1 are well known in the communications art, a detailed description of these other components will not be provided herein.

In accordance with an illustrative embodiment of the invention, the LNA may be a two-stage amplifier with input, inter-stage and output matching networks. High reverse isolation may be achieved through the use of a common-base amplifier for the first stage and a cascode amplifier for the second stage. Input, inter-stage and output matching networks may be realized using microstrip shunt-stub networks.

It is believed that the principles of the invention provide for the first known silicon implementation of a low-noise amplifier at 50 Ghz (Gigahertz) and above. The LNA topology of the invention realizes a low noise figure, a moderate to high (and adjustable) gain, and a high stability, as will be illustratively described below.

Figure 2:
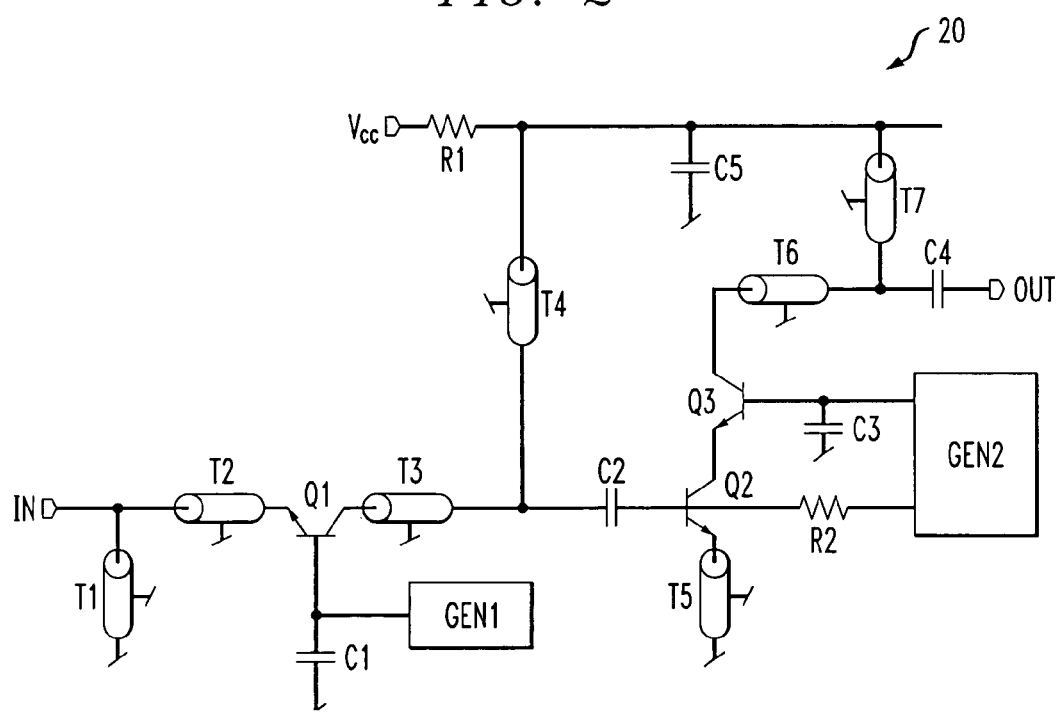
FIG. 2 is a schematic diagram illustrating a millimeter-wave unilateral low-noise amplifier according to an embodiment of the invention.

Referring now to FIG. 2, a schematic diagram illustrates a millimeter-wave unilateral low-noise amplifier according to an embodiment of the invention. As shown in FIG. 2, LNA 20 is a two-stage single-ended amplifier.

The input, output, and supply voltage terminals are labeled IN, OUT and VCC, respectively. A common-base amplifier (transistor Q1) is provided for the first stage, since it increases reverse isolation without requiring a cascode device, thereby realizing a noise advantage. The second stage is a degenerated cascode including transistors Q2 and Q3. Degeneration is provided by transmission line T5, which is a short-circuited microstrip transmission line.

It is to be appreciated that transistors Q1, Q2 and Q3 each include collector, base and emitter terminals (depicted in the figures using typical circuit drawing convention) that are respectively connected to other elements in the LNA circuit as shown.

Each stage of LNA 20 provides ~8 dB of gain at 3 mA (milliamps) and 60 Ghz. The bias voltages for stage 1 and stage 2 are provided by standard bias generator circuits (GEN1 and GEN2). One of ordinary skill in the art will realize various implementations of such bias generator circuits given the functional descriptions provided herein.

Since a quarter-wavelength in silicon-dioxide is ~600 μm (micrometers) at 60 GHz, shunt-stub microstrip transmission line (T1-T7) networks are used for the input, inter-stage and output match. T1 and T2 form the input matching network. T3 and T4 form the inter-stage matching network. T6 and T7 form the output matching network. DC (direct current) blocking capacitors C2 and C4 isolate stage 1 from stage 2 and stage 2 from the output. Bypass capacitors C1, C3 and C5, provide small-signal grounds. Finally, resistor R1 reduces the quality factor of the supply network, while resistor R2 isolates Q2 from GEN2. Numerous substrate contacts may be used in the layout to reduce substrate coupling.

Low-noise amplifiers have been implemented at 50, 60 and 77 GHz with the topology illustrated in FIG. 2. Additionally, this LNA topology has been implemented in a balanced configuration using two unbalanced LNAs as described herein together with branch-line couplers at the input and output. All of these illustrative LNAs have been implemented in 0.12-μm SiGe8T technology. SiGe8T is a silicon germanium technology available from IBM Corporation (Armonk, N.Y.) which features NPNs with $f_T$ greater than 200 GHz, $f_{MAX}$ greater than 250 GHz, and a $BV_{CEO}$ of 1.8 V (volts). The technology also includes metal-insulator-metal capacitors, metal-film resistors, and a 4-μm thick aluminum top metal layer, see, e.g., B. Jagannathan et al., "Self-aligned SiGe NPN transistors with 285 GHz $f_{MAX}$ and 207 GHz $f_T$ in a manufacturable technology," IEEE Electron Device Lett, vol. 23, no. 5, 2002, the disclosure of which is incorporated by reference herein. However, it is to be appreciated that other technologies may be employed, e.g., CMOS (complementary metal oxide semiconductor), SiGe, III-V, etc.

Figure 3:
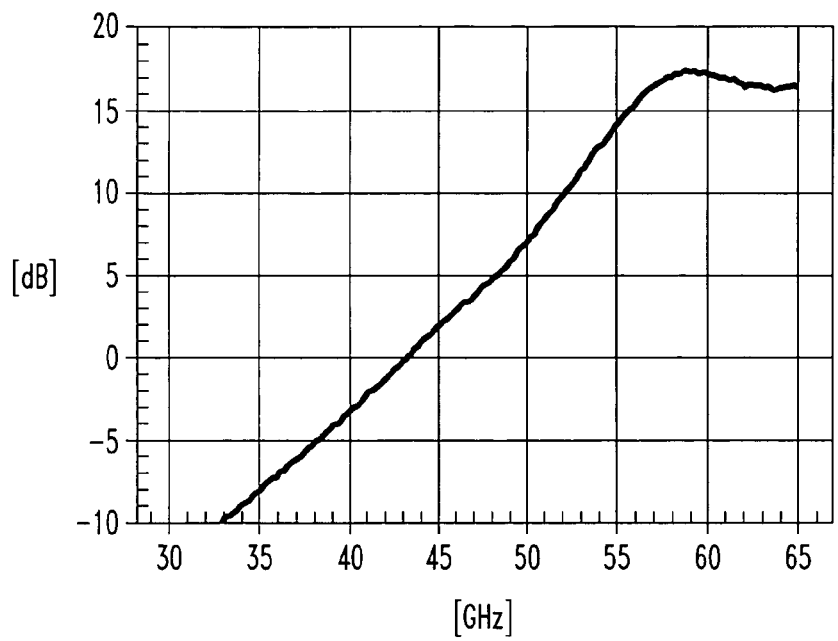
FIG. 3 is a graph illustrating a measured gain (S21) of a low-noise amplifier according to an embodiment of the invention.
Figure 4:
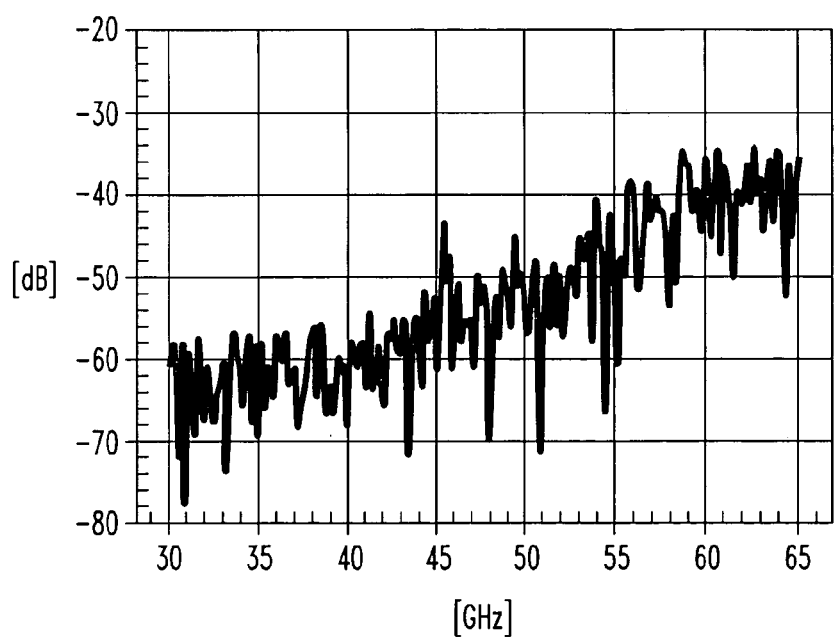
FIG. 4 is a graph illustrating a measured reverse isolation (S12) of a low-noise amplifier according to an embodiment of the invention.
Figure 5:
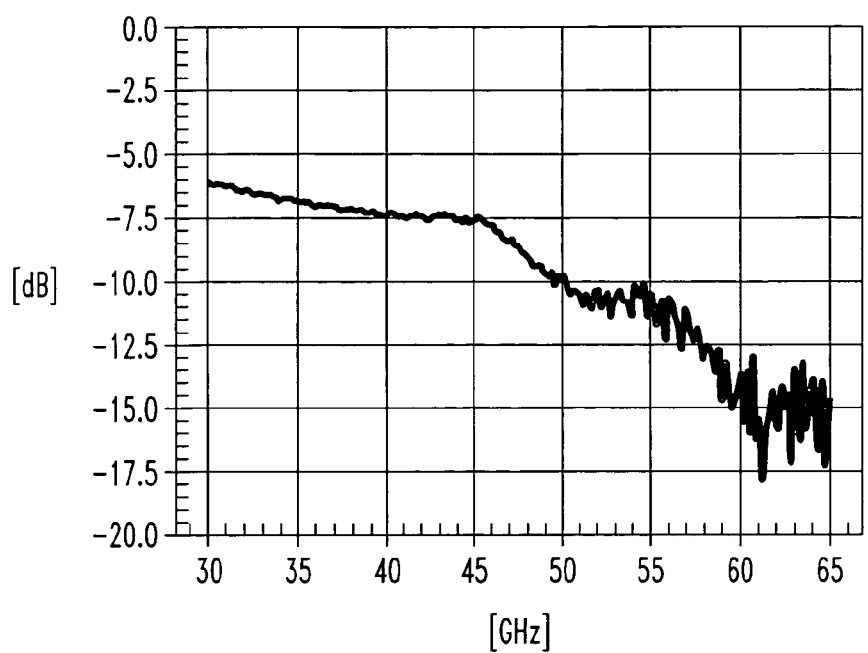
FIG. 5 is a graph illustrating a measured input reflection coefficient (S11) of a low-noise amplifier according to an embodiment of the invention.
Figure 6:
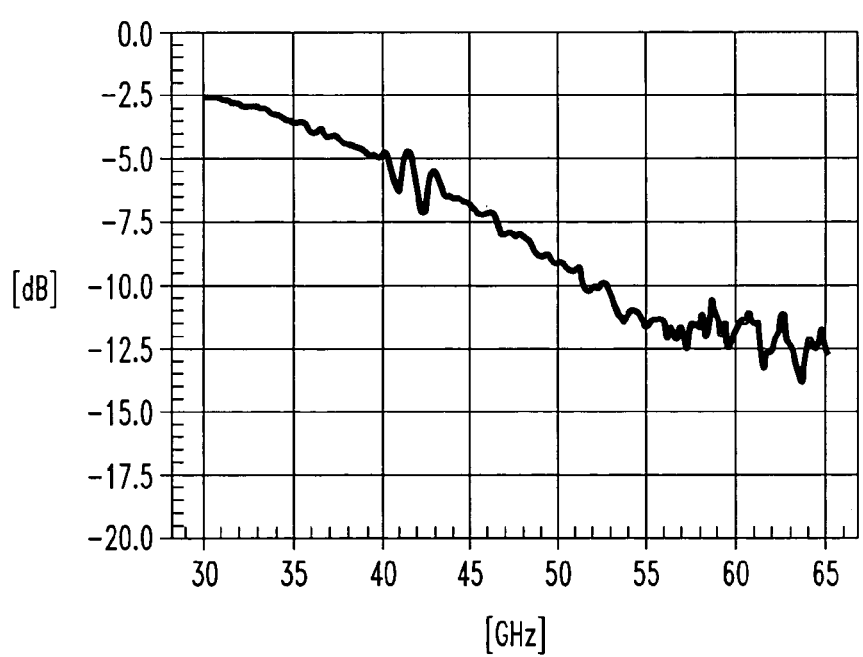
FIG. 6 is a graph illustrating a measured output reflection coefficient (S22) of a low-noise amplifier according to an embodiment of the invention.

FIG. 3 shows the measured wafer-probed gain ($S_{21}$) of the 60 GHz LNA, operating at 6 mA and VCC=1.8 V. A gain of 17 dB is achieved. FIG. 4 shows the measured wafer-probed reverse isolation ($S_{12}$) of the LNA, showing an isolation of ~40 dB at 61.5 Ghz. FIG. 5 shows the measured input reflection coefficient ($S_{11}$), while FIG. 6 shows the measured output reflection coefficient ($S_{22}$). Input and output return losses are 15 and 12 dB, respectively, at 61.5 Ghz. The LNA is unconditionally stable over 30-65 Ghz. The measured mean noise figure across the band is 3.5 dB, having values of 3.3 and 4.2 dB at 60 and 63 GHz, respectively (where excess noise ratio of the noise source is calibrated).

Figure 7:
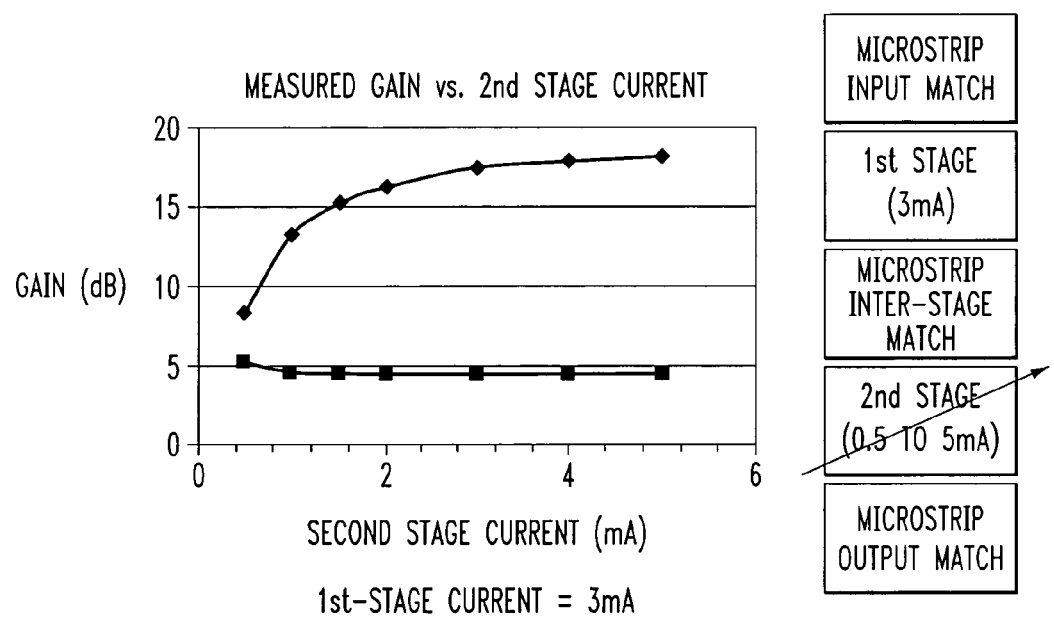
FIG. 7 is a graph illustrating a measured gain and noise figure as a function of second-stage current of a low-noise amplifier according to an embodiment of the invention.

Biasing of the two stages of the LNA is independent and adjustable. In particular, by changing the second-stage current, adjustable gain is obtained while the noise figure remains relatively constant. Having an adjustable second-stage bias is useful for both automatic gain control functionality as well as trading off gain for stability. FIG. 7 shows the measured gain and noise figure as a function of second-stage current. For this measurement, the first-stage of the LNA is biased at 2 mA.

From these results, it can be seen that the LNA of the present invention achieves advantageous performance measures, i.e., a moderate to high gain, a low noise figure, input and output impedance matching, and a high reverse isolation.

It is to be appreciated that while specific circuit embodiments of the principles of the invention have been provided and explained above, at least a portion of such inventive amplifier design approaches may be implemented, for example, by one or more digital signal processors with associated memory, application specific integrated circuit(s), one or more appropriately programmed general purpose digital computers with associated memory. One of ordinary skill in the art will contemplate various other ways of implementing the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An amplifier, comprising:
   a first amplifying stage comprising a common-base transistor;
   a second amplifying stage, coupled to the first amplifying stage, comprising a cascode transistor pair; and
   at least one matching network, coupled to at least one of the first amplifying stage and the second amplifying stage, comprising a series transmission line and a shunt stub.

2. The amplifier of claim 1, further comprising an input matching network coupled between an input terminal associated with the amplifier and the common-base transistor.

3. The amplifier of claim 1, further comprising an interstage matching network coupled between the common-base transistor and the cascode transistor pair.

4. The amplifier of claim 1, further comprising an output matching network coupled between an output terminal associated with the amplifier and the cascode transistor pair.

5. The amplifier of claim 1, wherein the first stage and the second stage are implemented in accordance with a silicon-based technology.

6. The amplifier of claim 1, wherein the first stage and the second stage are implemented in accordance with a silicon germanium technology.

7. The amplifier of claim 1, wherein the amplifier is a low-noise amplifier.

8. The amplifier of claim 7, wherein the low-noise amplifier is implemented in accordance with a millimeter-wave communications receiver.

9. The amplifier of claim 1, wherein the amplifier is a unilateral amplifier.

10. The amplifier of claim 1, wherein a current associated with the second amplifying stage is adjustable.

11. Apparatus for amplifying an input signal, comprising:
    a low-noise amplifier operative to amplify the input signal, wherein the low-noise amplifier is implemented in accordance with a silicon-based technology and the input signal is a millimeter-wave signal, and further wherein the low-noise amplifier comprises at least one matching network comprising a series transmission line and a shunt stub, wherein the low-noise amplifier comprises: a first amplifying stage comprising a common-base traistor; and a second amplifying stage, coupled to the first amplifying stage, comprising a cascode transistor pair.

12. The apparatus of claim 11, wherein the at least one matching network is coupled between an input terminal associated with the low-noise amplifier and the common-base transistor.

13. The apparatus of claim 11, wherein the at least one matching network is coupled between the common-base transistor and the cascode transistor pair.

14. The apparatus of claim 11, wherein the at least one matching network is coupled between an output terminal associated with the low-noise amplifier and the cascode transistor pair.

15. The apparatus of claim 11, wherein the low-noise amplifier is implemented in accordance with a silicon germanium technology.

16. Apparatus for amplifying an input signal, comprising:
    a unilateral low-noise amplifier operative to amplify the input signal, wherein the amplifier is implemented in accordance with a silicon germanium technology comprises at least one matching network comprising a series transmission line and a shunt stub, and wherein the input signal is a millimeter-wave signal, and wherein the amplifier comprises: a first amplifying stage cmprising a common-base tranistor; and a second amplifying stage, coupled to the first amplifying stage, comprising a cascode tranistor pair.

17. A communications receiver, comprising:
    a low-noise amplifier comprising:
      a first amplifying stage comprising a common-base transistor;
      a second amplifying stage, coupled to the first amplifying stage, comprising a cascode transistor pair; and
      at least one matching network, coupled to at least one of the first amplifying stage and the second amplifying stage, comprising a series transmission line and a shunt stub.

* * * * *

UNITED STATES PATENT AND TRADEMARK OFFICE
CERTIFICATE OF CORRECTION

| | | |
|---|---|---|
| PATENT NO. | : 7,265,630 B2 | Page 1 of 1 |
| APPLICATION NO. | : 10/731341 | |
| DATED | : September 4, 2007 | |
| INVENTOR(S) | : Brian Allan Floyd | |

It is certified that error appears in the above-identified patent and that said Letters Patent is hereby corrected as shown below:

In the claims:

Claim 11, col. 6, line 19, please delete "traistor" and insert --transistor--.

Claim 16, col. 6, line 45, please delete "tranistor" and insert --transistor--.

Claim 16, col. 6, line 47, please delete "tranistor" and insert --transistor--.

Signed and Sealed this

Twenty-fifth Day of December, 2007

JON W. DUDAS
*Director of the United States Patent and Trademark Office*